US010516088B2

(12) United States Patent
Kasichainula

(10) Patent No.: US 10,516,088 B2
(45) Date of Patent: Dec. 24, 2019

(54) PIN COUPLING BASED THERMOELECTRIC DEVICE

(71) Applicant: Sridhar Kasichainula, Fremont, CA (US)

(72) Inventor: Sridhar Kasichainula, Fremont, CA (US)

( * ) Notice: Subject to any disclaimer, the term of this patent is extended or adjusted under 35 U.S.C. 154(b) by 0 days.

(21) Appl. No.: 16/368,831

(22) Filed: Mar. 28, 2019

(65) Prior Publication Data

US 2019/0229249 A1  Jul. 25, 2019

Related U.S. Application Data

(63) Continuation of application No. 15/368,683, filed on Dec. 5, 2016, now Pat. No. 10,290,794.

(51) Int. Cl.
*H01L 35/30* (2006.01)
*H01L 35/08* (2006.01)
(Continued)

(52) U.S. Cl.
CPC ............ *H01L 35/30* (2013.01); *F24S 10/742* (2018.05); *F24S 70/60* (2018.05); *H01L 35/08* (2013.01);
(Continued)

(58) Field of Classification Search
CPC ......... H01L 35/30; H01L 35/08; H01L 35/32; H01L 35/34; H02S 10/30; H02S 40/44
See application file for complete search history.

(56) References Cited

U.S. PATENT DOCUMENTS 3,081,361 A 3/1963 Henderson et al.
3,197,342 A 7/1965 Neild, Jr.
(Continued)

FOREIGN PATENT DOCUMENTS

CN 1505252 A 6/2004
CN 1975448 A 6/2007
(Continued)

OTHER PUBLICATIONS

"Evaluating Energy-Harvesting Technologies for Wearable Designs", Article Library, Contributed by Publitek Marketing Communications, Dec. 3, 2014 by European Editors (pp. 4) http://www.digikey.com/en/articles/techzone/2014/dec/evaluating-energy-harvesting-technologies-for-wearable-designs.
(Continued)

*Primary Examiner* — Jayne L Mershon
(74) *Attorney, Agent, or Firm* — Legalforce RAPC Worldwide

(57) ABSTRACT

A hybrid solar-thermoelectric device includes a solar device and a thermoelectric device coupled thereto. The thermoelectric device includes a flexible first substrate, and a number of sets of N and P thermoelectric legs coupled to the first substrate. Each set includes an N and a P thermoelectric leg electrically contacting each other through a conductive material on the first substrate. The thermoelectric device also includes a rigid second substrate, a conductive thin film formed on the second substrate, and a number of pins corresponding to the number of sets of N and P thermoelectric legs. Each pin couples the each set on an end thereof away from the first substrate to the conductive thin film formed on the second substrate, and is several times longer than a height of the N and P thermoelectric legs.

20 Claims, 9 Drawing Sheets

(51) Int. Cl.
  *H01L 35/32*    (2006.01)
  *H01L 35/34*    (2006.01)
  *H02S 10/30*    (2014.01)
  *F24S 70/60*    (2018.01)
  *F24S 10/70*    (2018.01)
  *H02S 40/44*    (2014.01)
  *F24S 80/50*    (2018.01)

(52) U.S. Cl.
  CPC .............. *H01L 35/32* (2013.01); *H01L 35/34* (2013.01); *H02S 10/30* (2014.12); *H02S 40/44* (2014.12); *F24S 80/50* (2018.05)

(56) References Cited

U.S. PATENT DOCUMENTS

| | | | |
|---|---|---|---|
| 3,458,356 | A | 7/1969 | Kummer et al. |
| 3,508,968 | A | 4/1970 | Ovshinsky |
| 3,554,815 | A | 1/1971 | Osborn |
| 3,618,590 | A | 11/1971 | Frank et al. |
| 3,648,152 | A | 3/1972 | Katsunori |
| 3,666,566 | A | 5/1972 | Flaherty |
| 3,851,381 | A | 12/1974 | Alais et al. |
| 3,995,429 | A | 12/1976 | Peters |
| 4,036,665 | A | 7/1977 | Barr et al. |
| 4,039,352 | A | 8/1977 | Marinescu |
| 4,095,998 | A | 6/1978 | Hanson |
| 4,106,279 | A | 8/1978 | Martin et al. |
| 4,125,122 | A | 11/1978 | Stachurski |
| 4,213,292 | A | 7/1980 | Dolezal et al. |
| 4,251,291 | A | 2/1981 | Gomez |
| 4,338,560 | A | 7/1982 | Lemley |
| 4,382,154 | A | 5/1983 | Thery et al. |
| 4,443,650 | A | 4/1984 | Takagi et al. |
| 4,448,028 | A | 5/1984 | Chao et al. |
| 4,467,611 | A | 8/1984 | Nelson et al. |
| 4,497,973 | A | 2/1985 | Heath et al. |
| 4,551,857 | A | 11/1985 | Galvin |
| 4,673,863 | A | 6/1987 | Swarbrick |
| 4,946,511 | A | 8/1990 | Shiloh et al. |
| 5,180,928 | A | 1/1993 | Choi |
| 5,286,304 | A | 2/1994 | Macris et al. |
| 5,419,780 | A | 5/1995 | Suski |
| 5,427,086 | A | 6/1995 | Brownell |
| 5,521,375 | A | 5/1996 | Jang |
| 5,554,819 | A | 9/1996 | Baghai-Kermani |
| 5,563,368 | A | 10/1996 | Yamaguchi |
| 5,625,245 | A | 4/1997 | Bass |
| 5,705,770 | A | 1/1998 | Ogasawara et al. |
| 5,712,448 | A | 1/1998 | Vandersande et al. |
| 5,817,188 | A | 10/1998 | Yahatz et al. |
| 5,889,735 | A | 3/1999 | Kawata et al. |
| 5,892,656 | A | 4/1999 | Bass |
| 5,929,372 | A | 7/1999 | Oudoire et al. |
| 5,950,067 | A | 9/1999 | Maegawa et al. |
| 5,959,240 | A | 9/1999 | Yoshida et al. |
| 6,043,423 | A | 3/2000 | Satomura et al. |
| 6,066,902 | A | 5/2000 | Maurio et al. |
| 6,075,199 | A | 6/2000 | Wong |
| 6,166,317 | A | 12/2000 | Volk, Jr. |
| 6,207,887 | B1 | 3/2001 | Bass et al. |
| 6,271,459 | B1 | 8/2001 | Yoo |
| 6,281,594 | B1 | 8/2001 | Sarich |
| 6,300,150 | B1 | 10/2001 | Venkatasubramanian |
| 6,304,520 | B1 | 10/2001 | Watanabe |
| 6,307,142 | B1 | 10/2001 | Allen et al. |
| 6,313,393 | B1 | 11/2001 | Drost |
| 6,314,741 | B1 | 11/2001 | Hiraishi |
| 6,320,280 | B1 | 11/2001 | Kanesaka |
| 6,329,217 | B1 | 12/2001 | Watanabe et al. |
| 6,367,261 | B1 | 4/2002 | Marshall et al. |
| 6,407,965 | B1 | 6/2002 | Matoge et al. |
| 6,410,971 | B1 | 6/2002 | Otey |
| 6,426,921 | B1 | 7/2002 | Mitamura |
| 6,433,465 | B1 | 8/2002 | McKnight et al. |
| 6,548,894 | B2 | 4/2003 | Chu et al. |
| 6,598,405 | B2 | 7/2003 | Bell |
| 6,605,773 | B2 | 8/2003 | Kok et al. |
| 6,620,994 | B2 | 9/2003 | Rossi |
| 6,700,310 | B2 | 3/2004 | Maue et al. |
| 6,729,183 | B2 | 5/2004 | Tanimoto et al. |
| 6,846,983 | B1 | 1/2005 | Warehime |
| 6,870,766 | B2 | 3/2005 | Cho et al. |
| 6,882,128 | B1 | 4/2005 | Rahmel et al. |
| 6,914,343 | B2 | 7/2005 | Hiller et al. |
| 7,081,693 | B2 | 7/2006 | Hamel et al. |
| 7,282,384 | B2 | 10/2007 | Shin et al. |
| 7,360,365 | B2 | 4/2008 | Codecasa et al. |
| 7,397,169 | B2 | 7/2008 | Nersessian et al. |
| 7,400,050 | B2 | 7/2008 | Jovanovic et al. |
| 7,488,888 | B2 | 2/2009 | Mitchell et al. |
| 7,493,766 | B2 | 2/2009 | Yang et al. |
| 7,532,937 | B2 | 5/2009 | Horio et al. |
| 7,649,139 | B2 | 1/2010 | Mihara et al. |
| 7,770,645 | B2 | 8/2010 | Jeffryes |
| 7,777,126 | B2 | 8/2010 | Chu |
| 7,800,194 | B2 | 9/2010 | Freedman |
| 7,800,278 | B2 | 9/2010 | Ujihara et al. |
| 7,834,263 | B2 | 11/2010 | DeSteese et al. |
| 7,851,691 | B2 | 12/2010 | DeSteese et al. |
| 7,851,932 | B2 | 12/2010 | Rome et al. |
| 7,878,283 | B2 | 2/2011 | Richter et al. |
| 7,939,743 | B2 | 5/2011 | Leng et al. |
| 8,046,993 | B2 | 11/2011 | Kao |
| 8,216,871 | B2 | 7/2012 | McCann |
| 8,237,043 | B2 | 8/2012 | Kondoh |
| 8,269,097 | B2 | 9/2012 | Asatani et al. |
| 8,269,098 | B2 | 9/2012 | Chu |
| 8,294,020 | B2 | 10/2012 | Mitchell et al. |
| 8,404,959 | B2 | 3/2013 | Donley |
| 8,404,960 | B2 | 3/2013 | Prather et al. |
| 8,421,313 | B2 | 4/2013 | Shih et al. |
| 8,421,403 | B2 | 4/2013 | Newman |
| 8,519,505 | B2 | 8/2013 | Hiroshige et al. |
| 8,519,595 | B2 | 8/2013 | Hunter et al. |
| 8,594,803 | B2 | 11/2013 | Magdych |
| 8,604,571 | B2 | 12/2013 | Uchida et al. |
| 8,653,357 | B2 | 2/2014 | Prather et al. |
| 8,685,758 | B2 | 4/2014 | Suzuki et al. |
| 8,777,441 | B2 | 7/2014 | Vazquez |
| 8,802,964 | B2 | 8/2014 | Meng et al. |
| 8,948,870 | B2 | 2/2015 | Imran |
| 8,952,235 | B2 | 2/2015 | Span et al. |
| 8,975,503 | B2 | 3/2015 | Mitchell et al. |
| 9,215,905 | B2 | 12/2015 | Tseng |
| 9,224,936 | B2 | 12/2015 | Nakamura et al. |
| 9,431,593 | B2 | 8/2016 | Kato et al. |
| 9,455,390 | B2 | 9/2016 | Kurihara et al. |
| 2002/0047489 | A1 | 4/2002 | Oudakker |
| 2002/0117198 | A1 | 8/2002 | Kok et al. |
| 2002/0148235 | A1 | 10/2002 | Bell |
| 2003/0223919 | A1 | 12/2003 | Kwak et al. |
| 2004/0045594 | A1 | 3/2004 | Hightower |
| 2004/0094192 | A1 | 5/2004 | Luo |
| 2004/0177876 | A1 | 9/2004 | Hightower |
| 2004/0183306 | A1 | 9/2004 | Rome |
| 2004/0238022 | A1 | 12/2004 | Hiller et al. |
| 2005/0000559 | A1 | 1/2005 | Horio et al. |
| 2005/0022855 | A1 | 2/2005 | Raver |
| 2005/0087222 | A1 | 4/2005 | Muller-Werth |
| 2005/0115600 | A1 | 6/2005 | DeSteese et al. |
| 2005/0139248 | A1 | 6/2005 | Strnad |
| 2005/0139250 | A1 | 6/2005 | DeSteese et al. |
| 2005/0205125 | A1 | 9/2005 | Nersessian et al. |
| 2005/0236028 | A1 | 10/2005 | Strnad |
| 2006/0048807 | A1 | 3/2006 | Lee et al. |
| 2006/0107990 | A1 | 5/2006 | Adachi et al. |
| 2006/0118157 | A1 | 6/2006 | Johnson et al. |
| 2006/0130888 | A1 | 6/2006 | Yamaguchi et al. |
| 2006/0201161 | A1 | 9/2006 | Hirai et al. |
| 2006/0207643 | A1 | 9/2006 | Weaver et al. |
| 2006/0208492 | A1 | 9/2006 | Jovanovic et al. |
| 2006/0243317 | A1 | 11/2006 | Venkatasubramanian |
| 2006/0254638 | A1 | 11/2006 | Carmeli et al. |

(56) References Cited

U.S. PATENT DOCUMENTS

| | | |
|---|---|---|
| 2007/0000068 A1 | 1/2007 | Gerard France et al. |
| 2007/0028956 A1 | 2/2007 | Venkatasubramanian et al. |
| 2007/0056622 A1 | 3/2007 | Leng et al. |
| 2007/0095379 A1 | 5/2007 | Taher et al. |
| 2007/0125413 A1 | 6/2007 | Olsen et al. |
| 2007/0193617 A1 | 8/2007 | Taguchi |
| 2007/0283702 A1 | 12/2007 | Strnad |
| 2007/0290287 A1 | 12/2007 | Freedman |
| 2008/0017238 A1 | 1/2008 | Fei et al. |
| 2008/0065172 A1 | 3/2008 | Magdych |
| 2008/0066796 A1 | 3/2008 | Mitchell et al. |
| 2008/0092937 A1 | 4/2008 | Mitchell et al. |
| 2008/0173537 A1 | 7/2008 | DeSteese et al. |
| 2008/0264464 A1 | 10/2008 | Lee et al. |
| 2008/0283110 A1 | 11/2008 | Jin et al. |
| 2009/0000652 A1 | 1/2009 | von Windheim et al. |
| 2009/0025773 A1 | 1/2009 | Stark |
| 2009/0217960 A1 | 9/2009 | Tubel et al. |
| 2009/0260358 A1 | 10/2009 | Rapp et al. |
| 2009/0315335 A1 | 12/2009 | Ujihara et al. |
| 2010/0063557 A1 | 3/2010 | Imran |
| 2010/0065096 A1 | 3/2010 | Pellegrini |
| 2010/0154855 A1 | 6/2010 | Nemir et al. |
| 2010/0186399 A1 | 7/2010 | Huttinger |
| 2010/0257871 A1 | 10/2010 | Venkatasubramanian et al. |
| 2010/0300504 A1 | 12/2010 | Ceron Parisi et al. |
| 2010/0319745 A1 | 12/2010 | Meng et al. |
| 2011/0084349 A1 | 4/2011 | Uchida et al. |
| 2011/0139398 A1 | 6/2011 | Bauer et al. |
| 2011/0140458 A1 | 6/2011 | Arnold et al. |
| 2011/0169372 A1 | 7/2011 | Lim |
| 2011/0220162 A1 | 9/2011 | Siivola et al. |
| 2012/0000500 A1 | 1/2012 | Iida et al. |
| 2012/0081066 A1 | 4/2012 | Newman |
| 2012/0160290 A1 | 6/2012 | Chen et al. |
| 2012/0192910 A1 | 8/2012 | Fowler et al. |
| 2012/0227779 A1 | 9/2012 | Miao et al. |
| 2012/0291425 A1 | 11/2012 | Mitchell et al. |
| 2012/0312343 A1 | 12/2012 | VanVechten et al. |
| 2013/0019460 A1 | 1/2013 | Mayes |
| 2013/0021002 A1 | 1/2013 | Mayes |
| 2013/0021788 A1 | 1/2013 | Mayes |
| 2013/0087180 A1 | 4/2013 | Stark et al. |
| 2013/0206199 A1 | 8/2013 | Lassiter et al. |
| 2013/0249301 A1 | 9/2013 | Smoot et al. |
| 2013/0298957 A1 | 11/2013 | Hiroshige et al. |
| 2014/0015470 A1 | 1/2014 | Lim et al. |
| 2014/0020728 A1 | 1/2014 | Chung |
| 2014/0090150 A1 | 4/2014 | Skertic |
| 2014/0096810 A1 | 4/2014 | Nakamura et al. |
| 2014/0137917 A1 | 5/2014 | Al-Merbati et al. |
| 2014/0159637 A1 | 6/2014 | Ebersold |
| 2014/0246066 A1 | 9/2014 | Chen et al. |
| 2014/0299169 A1 | 10/2014 | Schneider et al. |
| 2014/0326287 A1 | 11/2014 | Wiant et al. |
| 2014/0345666 A1 | 11/2014 | Konnai et al. |
| 2014/0348453 A1 | 11/2014 | Bartl et al. |
| 2014/0360548 A1 | 12/2014 | Bartl et al. |
| 2014/0373888 A1 | 12/2014 | Boukai et al. |
| 2014/0375246 A1 | 12/2014 | Boysen, III et al. |
| 2015/0048249 A1 | 2/2015 | Hedler et al. |
| 2015/0162517 A1 | 6/2015 | Kasichainula |
| 2015/0188019 A1 | 7/2015 | Corrado et al. |
| 2015/0214823 A1 | 7/2015 | Shastry et al. |
| 2015/0282227 A1 | 10/2015 | Yousef et al. |
| 2015/0324181 A1 | 11/2015 | Segal |
| 2016/0006123 A1 | 1/2016 | Li et al. |
| 2016/0126438 A1* | 5/2016 | Marc .................. H01L 35/10 136/204 |
| 2016/0233402 A1 | 8/2016 | Suda et al. |
| 2016/0336501 A1 | 11/2016 | Kasichainula |
| 2017/0012195 A1 | 1/2017 | Grishin |

FOREIGN PATENT DOCUMENTS

| | | |
|---|---|---|
| CN | 101454914 A | 6/2009 |
| CN | 201739025 U | 2/2011 |
| CN | 201781448 U | 3/2011 |
| CN | 201830182 U | 5/2011 |
| CN | 202005376 U | 10/2011 |
| CN | 102629842 A | 8/2012 |
| CN | 202602564 U | 12/2012 |
| CN | 102891635 A | 1/2013 |
| CN | 202651208 U | 1/2013 |
| CN | 202713203 U | 1/2013 |
| CN | 202978757 U | 6/2013 |
| CN | 203086385 U | 7/2013 |
| CN | 203119810 U | 8/2013 |
| CN | 103325935 A | 9/2013 |
| CN | 103534826 A | 1/2014 |
| CN | 204168184 U | 2/2015 |
| CN | 104638742 A | 5/2015 |
| CN | 103178754 B | 7/2015 |
| CN | 204669251 U | 9/2015 |
| DE | 2355863 A1 | 5/1974 |
| DE | 3735410 A1 | 5/1989 |
| DE | 3807633 A1 | 9/1989 |
| DE | 4208358 A1 | 9/1993 |
| DE | 4313827 A1 | 11/1994 |
| DE | 19732399 A1 | 2/1999 |
| DE | 19919023 A1 | 12/2000 |
| DE | 10004390 C2 | 5/2002 |
| DE | 10112383 B4 | 1/2004 |
| DE | 2972418 U1 | 8/2006 |
| DE | 102006014414 A1 | 10/2007 |
| DE | 102006039024 A1 | 2/2008 |
| DE | 102006057662 A1 | 6/2008 |
| DE | 102008030758 A1 | 1/2009 |
| DE | 102008005334 A1 | 7/2009 |
| DE | 102008009979 A1 | 9/2009 |
| DE | 202010003713 U1 | 7/2010 |
| DE | 202010011515 U1 | 11/2010 |
| DE | 102008031266 B4 | 5/2013 |
| DE | 102007017461 B4 | 4/2014 |
| EP | 0117743 A3 | 11/1986 |
| EP | 4118979 A1 | 12/1992 |
| EP | 0644599 A2 | 3/1995 |
| EP | 0935334 A2 | 8/1999 |
| EP | 0993117 A3 | 2/2002 |
| EP | 2764268 B1 | 8/2015 |
| JP | 2003102186 A | 4/2003 |
| JP | 3447915 B2 | 9/2003 |
| JP | 2005228160 A | 8/2005 |
| JP | 2006086510 A | 3/2006 |
| JP | 2013225550 A | 10/2013 |
| JP | 3196069 U | 2/2015 |
| KR | 20160109658 A | 9/2016 |
| WO | 1985005406 A1 | 12/1985 |
| WO | 1989007836 A1 | 8/1989 |
| WO | 1995030246 A1 | 11/1995 |
| WO | 1997045882 A1 | 12/1997 |
| WO | 1999007024 A1 | 2/1999 |
| WO | 1999010937 A1 | 3/1999 |
| WO | 2001082343 A2 | 11/2001 |
| WO | 2003007391 A1 | 1/2003 |
| WO | 2003015186 A2 | 2/2003 |
| WO | 2005086246 A2 | 9/2005 |
| WO | 2005098225 A1 | 10/2005 |
| WO | 2006003956 A1 | 1/2006 |
| WO | 2006001827 A3 | 4/2006 |
| WO | 2006110858 A2 | 10/2006 |
| WO | 2008013584 A2 | 1/2008 |
| WO | 2008025701 A2 | 3/2008 |
| WO | 2008095582 A1 | 8/2008 |
| WO | 2008134022 A2 | 11/2008 |
| WO | 2007142934 A3 | 12/2008 |
| WO | 2009045662 A3 | 11/2009 |
| WO | 2009151000 A1 | 12/2009 |
| WO | 2010048066 A2 | 4/2010 |
| WO | 2010101049 A1 | 9/2010 |
| WO | 2010113257 A1 | 10/2010 |
| WO | 2010138835 A2 | 12/2010 |

(56) References Cited

FOREIGN PATENT DOCUMENTS

| | | |
|---|---|---|
| WO | 2011091620 A1 | 8/2011 |
| WO | 2012130568 A1 | 10/2012 |
| WO | 2012165990 A1 | 12/2012 |
| WO | 2013050415 A1 | 4/2013 |
| WO | 2013108518 A1 | 7/2013 |
| WO | 2013109729 A1 | 7/2013 |
| WO | 2013135447 A1 | 9/2013 |
| WO | 2014064755 A1 | 5/2014 |
| WO | 2014082028 A1 | 5/2014 |
| WO | 2015045500 A1 | 4/2015 |
| WO | 2015103483 A1 | 7/2015 |
| WO | 2015126272 A1 | 8/2015 |
| WO | 2015148411 A1 | 10/2015 |
| WO | 20151649003 A1 | 11/2015 |
| WO | 2015193177 A2 | 12/2015 |
| WO | 2015193634 A1 | 12/2015 |
| WO | 2016003482 A1 | 1/2016 |
| WO | 2016147918 A1 | 9/2016 |

OTHER PUBLICATIONS

"Energy Harvesting Moves into Wearable Electronics", Article Library, Contributed By Publitek Marketing Communications, Feb. 15, 2012 by European Editors (pp. 5) http://www.digikey.com/en/articles/techzone/2012/feb/energy-harvesting-moves-into-wearable-electronics.

"Top 5 Energy Harvesting Options for Wearable Devices", Avnet, 2016 by James C. Hess (pp. 2) http://www.em.avnet.com/en-us/design/technical-articles/Pages/Articles/Top-5-Energy-Harvesting-Options-for-Wearable-Devices.aspx.

"Review of Energy Harvesting Techniques and Applications for Microelectronics", Polytechnic University of Catalonia, Department of Electronic Engineering Barcelona, Spain, 2005 by Loreto Mateu et al. (p. 1) http://upcommons.upc.edu/handle/2117/613?locale-attribute=en.

"Energy Harvesting Technology Can Be The Wave Of The Future", Wearable Technologies Conference, San Fransisco, Jul. 13, 2015 by by Spela Kosir (pp. 8) https://www.wearable-technologies.com/2015/07/energy-harvesting-technology-can-be-the-wave-of-the-future/.

"Thermoelectric Energy Harvesting 2014-2024: Devices, Applications, Opportunities", IDTechEx by Dr Harry Zervos (pp. 3) http://www.idtechex.com/research/reports/thermoelectric-energy-harvesting-2014-2024-devices-applications-opportunities-00392.asp.

"TEGwear™ Technology", Perpetua—Renewable Energy Solutions For Wireless Sensors, 2015 (p. 1) http://www.perpetuapower.com/technology.htm.

"Thin-film Thermoelectric—Energy Harvesting for Internet of Things", Thermogen, 2016 (pp. 4) http://www.thermogentech.com/#services.

"Thermoelectric Fabrics: Toward Power Generating Clothing", Scientific Reports 5, Article No. 6411, Mar. 23, 2015 by Yong Du et al. (pp. 15) http://www.nature.com/articles/srep06411.

"Energy harvesting for assistive and mobile applications", Energy Science and Engineering, vol. 3, Issue 3, Feb. 17, 2015 by Vikrant Bhatnagar et al. (pp. 14) http://onlinelibrary.wiley.com/doi/10.1002/ese3.63/full.

"A Shoe-Embedded Piezoelectric Energy Harvester for Wearable Sensors", Sensors, Jul. 11, 2014 by Jingjing Zhao et al. (pp. 9) http://www.ncbi.nlm.nih.gov/pmc/articles/PMC4168512/.

"Energy Harvesting Peltier Ring", HackADay, Feb. 2, 2016 by James Hobson (p. 1) http://hackaday.com/2013/12/02/energy-harvesting-peltier-ring/.

"Recharging Batteries using Energy Harvested from Thermal Gradients", Journal of Intelligent Material Systems Structures, Department of Mechanical Engineering, Michigan Technological University, Jan. 2007 by Henry A. Sodano et al. (p. 1) http://jim.sagepub.com/content/18/1/3.short.

"Flexible Thin-film Thermoelectric Generator Inserting or Buffer Layer", National Institute of Advanced Industrial Science and Technology, Dec. 2, 2012 by M. Mizoshiri et al. (pp. 4) http://cap.ee.ic.ac.uk/~pdm97/powermems/2012/poster/P-058.pdf.

"Miniaturized Thermoelectric Power Sources", 34th Intersociety Energy Conversion Engineering Conference Proc., Vancouver, BC, Canada, 1999 by J. P. Fleurial et al. (pp. 5) http://www.thermoelectrics.caltech.edu/publications/pdf/IECEC-992569-Paper.pdf.

"Flexible Thermoelectric Materials and Device Optimization for Wearable Energy Harvesting", Journal of Materials Chemistry C, Materials for optical, magnetic and electronic devices, Issue 40, Jul. 1, 2015 by Je-Hyeong Bahk et al. (p. 1) http://pubs.rsc.org/en/Content/ArticleLanding/2015/TC/c5tc01644d#!divAbstract.

"Thick-film Thermoelectric Microdevices", IEEE Xplore, Sep. 2, 1999 by J. P. Fleurial et al. (pp. 2) http://ieeexplore.ieee.org/xpl/login.jsp?tp=&arnumber=843388&url=http%3A%2F%2Fieeexplore.ieee.org%2Fiel5%2F6791%2F18227%2F00843388.pdf%3Farnumber%3D843388.

"Thermoelectric Microconverter for Energy Harvesting Systems", Industrial Electronics, IEEE, Oct. 20, 2009 by J. P. Carmo et al. (pp. 2) http://ieeexplore.ieee.org/xpl/login.jsp?tp=&arnumber=5290158&url=http%3A%2F%2Fieeexplore.ieee.org%2Fxpls%2Fabs_all.jsp%3Farnumber%3D5290158.

"New Micro Thermoelectric Devices Based on Bismuth Telluride-type Thin Solid Films", IEEE Xplore, Sep. 2, 1999 by Stark et al. (pp. 2) http://ieeexplore.ieee.org/xpl/login.jsp?tp=&arnumber=843432&url=http%3A%2F%2Fieeexplore.ieee.org%2Fxpls%2Fabs_all.jsp%3Farnumber%3D843432.

"Modelling and Experimental Verification of Ge/SiGe Thermoelectric Generator", IEEE Xplore, Jul. 2, 2015 by A. Odia et al. (pp. 2) http://ieeexplore.ieee.org/xpl/articleDetails.jsp?arnumber=7251383&queryText=voltage%20generating%20thermoelectric%20device&newsearch=true.

"Thermoelectric Power Generator Design and Selection from TE Cooling Module Specifications", IEEE Xplore, Aug. 29, 1997 by R.J. Buist et al. (pp. 2) http://ieeexplore.ieee.org/xpl/articleDetails.jsp?arnumber=667589&queryText=voltage%20generating%20thermoelectric%20device&newsearch=true.

"A Dual Mode Thermoelectric Energy Harvesting Circuit Using Transformer-Based Boost Converter, Charge pump and Time-domain Digital Control", IEEE Xplore, Jun. 20, 2014 by Ying-Khai Teh et al. (pp. 2) http://ieeexplore.ieee.org/xpl/articleDetails.jsp?arnumber=7061101&queryText=voltage%20generating%20thermoelectric%20device&pageNumber=2&newsearch=true&searchField=Search_All.

"Power Generation of Thermoelectric Oxide Modules", IEEE Xplore, Jun. 23, 2005 by R. Funahashi et al. (pp. 2) http://ieeexplore.ieee.org/xpl/articleDetails.jsp?arnumber=1519947&queryText=voltage%20generating%20thermoelectric%20device&pageNumber=2&newsearch=true&searchField=Search_All.

"Nonlinear Anisotropic Thermoelectric Energy Converter Based on Semiconductor Films", IEEE Xplore, Aug. 21, 2003 by L.P. Bulat (pp. 2) http://ieeexplore.ieee.org/xpl/articleDetails.jsp?arnumber=1287525&queryText=voltage%20generating%20thermoelectric%20device&pageNumber=2&newsearch=true&searchField=Search_All.

"Thermoelectric Generator for Heat Meter", IEEE Xplore, 2001 by Xiaoguang Liu et al. (pp. 2) http://ieeexplore.ieee.org/xpl/articleDetails.jsp?arnumber=979920&queryText=voltage%20generating%20thermoelectric%20device&pageNumber=2&newsearch=true&searchField=Search_All.

"Mixed Thick-/Thin Film Thermoelectric Microgenerators", IEEE Xplore, Sep. 4, 2008 by P. Markowski et al. (pp. 2) http://ieeexplore.ieee.org/xpl/articleDetails.jsp?arnumber=4684419&queryText=voltage%20generating%20thermoelectric%20device&pageNumber=2&newsearch=true&searchField=Search_All.

\* cited by examiner

PIN COUPLING BASED THERMOELECTRIC DEVICE

CLAIM OF PRIORITY

This Application is a Continuation and a Divisional Application of, and thereby claims priority to, co-pending patent application Ser. No. 15/368,683 titled PIN COUPLING BASED THERMOELECTRIC DEVICE filed on Dec. 5, 2016. The entirely of the disclosure thereof is incorporated herein.

FIELD OF TECHNOLOGY

This disclosure relates generally to thermoelectric devices and, more particularly, to a pin coupling based thermoelectric device.

BACKGROUND

A thermoelectric device may be formed from alternating N and P elements/legs made of semiconducting material on a rigid substrate (e.g., alumina) joined on a top thereof to another rigid substrate/plate (e.g., again, alumina). However, a traditional implementation of the thermoelectric device may be limited in application thereof because of rigidity, bulkiness, size and high costs (>$20/watt) associated therewith.

SUMMARY

Disclosed are a method, a device and/or a system of a pin coupling based thermoelectric device.

In one aspect, a hybrid solar-thermoelectric device includes a solar device, and a thermoelectric device coupled to the solar device. The thermoelectric device includes a flexible first substrate, and a number of sets of N and P thermoelectric legs coupled to the first substrate. Each set includes an N thermoelectric leg and a P thermoelectric leg electrically contacting each other through a conductive material on the first substrate. The thermoelectric device also includes a rigid second substrate, a conductive thin film formed on the second substrate, and a number of pins corresponding to the number of sets of N and P thermoelectric legs.

Each pin couples the each set on an end thereof away from the first substrate to the conductive thin film formed on the second substrate, and is several times longer than a height of the N thermoelectric leg and the P thermoelectric leg of the each set. A temperature difference across the N thermoelectric leg and the P thermoelectric leg of the each set on the first substrate is controlled based on varying a height of the each pin, varying a thickness of the each pin and/or replacing the each pin with another pin having a different area therefrom.

In another aspect, a hybrid solar-thermoelectric device includes a solar device, and a thermoelectric device coupled to the solar device. The thermoelectric device includes a flexible first substrate, and a number of sets of N and P thermoelectric legs coupled to the first substrate. Each set includes an N thermoelectric leg and a P thermoelectric leg electrically contacting each other through a conductive material on the first substrate. The thermoelectric device also includes a rigid second substrate, a conductive thin film formed on the second substrate, and a number of pins corresponding to the number of sets of N and P thermoelectric legs.

Each pin couples the each set on an end thereof away from the first substrate to the conductive thin film formed on the second substrate, and is several times longer than a height of the N thermoelectric leg and the P thermoelectric leg of the each set. Heat or cold is configured to be applied at an end of the first substrate or the second substrate. In accordance with the application of the heat or the cold at the end of the first substrate or the second substrate, a temperature difference across the N thermoelectric leg and the P thermoelectric leg of the each set on the first substrate is controlled based on varying a height of the each pin, varying a thickness of the each pin and/or replacing the each pin with another pin having a different area therefrom.

In yet another aspect, a hybrid solar-thermoelectric device includes a solar device, and a thermoelectric device coupled to the solar device. The thermoelectric device includes a flexible first substrate, and a number of sets of N and P thermoelectric legs coupled to the first substrate. Each set includes an N thermoelectric leg and a P thermoelectric leg electrically contacting each other through a conductive material on the first substrate. The thermoelectric device also includes a rigid second substrate, a conductive thin film formed on the second substrate, and a number of pins corresponding to the number of sets of N and P thermoelectric legs.

Each pin couples the each set on an end thereof away from the first substrate to the conductive thin film formed on the second substrate, and is several times longer than a height of the N thermoelectric leg and the P thermoelectric leg of the each set. Further, the thermoelectric device includes a set of terminals formed on the first substrate to measure potential difference generated based on application of heat or cold at an end of the thermoelectric device. A temperature difference across the N thermoelectric leg and the P thermoelectric leg of the each set on the first substrate is controlled based on varying a height of the each pin, varying a thickness of the each pin and/or replacing the each pin with another pin having a different area therefrom.

The methods and systems disclosed herein may be implemented in any means for achieving various desired aspects of thermoelectric devices disclosed herein for applications including but not limited to wearable devices, automotive devices and/or components, solar devices and Internet of Things (IoT).

Other features will be apparent from the accompanying drawings and from the detailed description that follows.

BRIEF DESCRIPTION OF THE DRAWINGS

The embodiments of this invention are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Example embodiments, as described below, may be used to provide a method, a device and/or a system of a pin coupling based thermoelectric device. Although the present embodiments have been described with reference to specific example embodiments, it will be evident that various modifications and changes may be made to these embodiments without departing from the broader spirit and scope of the various embodiments.

Figure 1:
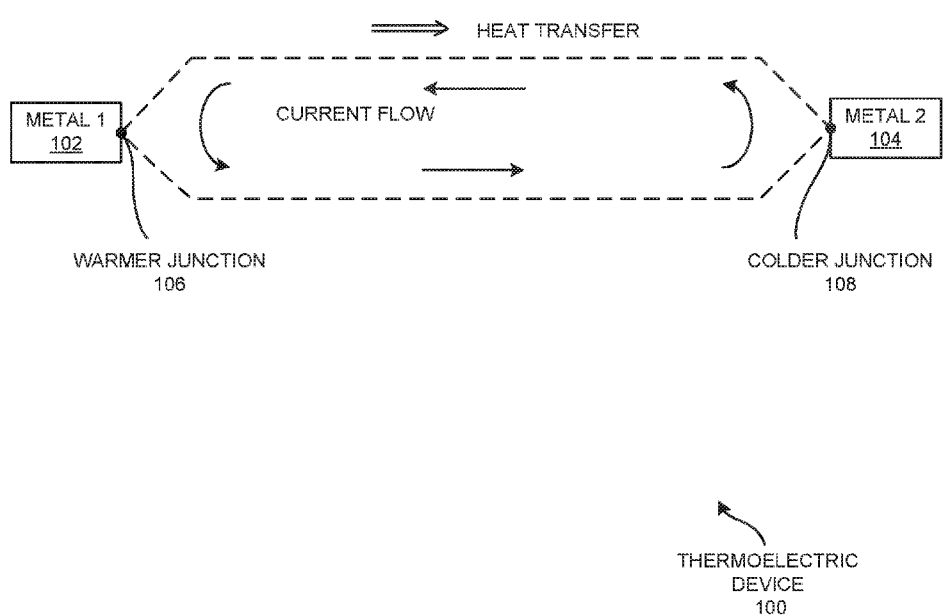
FIG. 1 is a schematic view of a thermoelectric device.

FIG. 1 shows a thermoelectric device 100. Thermoelectric device 100 may include different metals, metal 1 102 and metal 2 104, forming a closed circuit. Here, a temperature difference between junctions of said dissimilar metals leads to energy levels of electrons therein shifted in a dissimilar manner. This results in a potential/voltage difference between the warmer (e.g., warmer junction 106) of the junctions and the colder (e.g., colder junction 108) of the junctions. The aforementioned conversion of heat into electricity at junctions of dissimilar metals is known as Seebeck effect.

The most common thermoelectric devices in the market may utilize alternative P and N type legs/pellets/elements made of semiconducting materials. As heat is applied to one end of a thermoelectric device based on P and N type elements, charge carriers thereof may be released into the conduction band. Electron (charge carrier) flow in the N type element may contribute to a current flowing from the end (hot end) where the heat is applied to the other end (cold end). Hole (charge carrier) flow in the P type element may contribute to a current flowing from the other end (cold end) to the end (hot end) where the heat is applied. Here, heat may be removed from the cold end to prevent equalization of charge carrier distribution in the semiconductor materials due to migration thereof.

Figure 2:
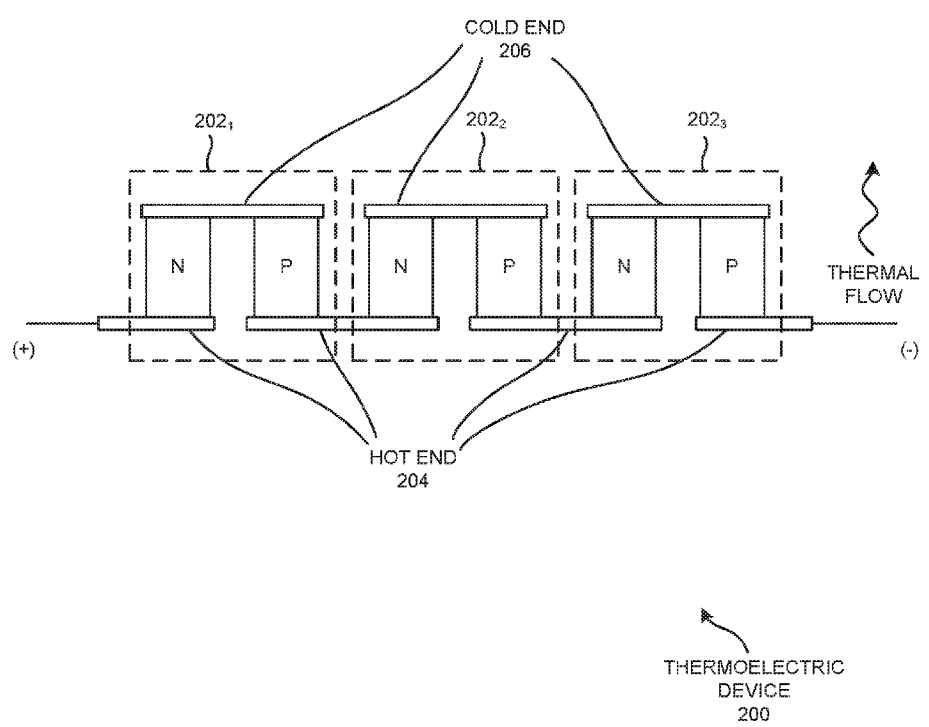
FIG. 2 is a schematic view of an example thermoelectric device with alternating P and N elements.

In order to generate voltage at a meaningful level to facilitate one or more application(s), typical thermoelectric devices may utilize alternating P and N type elements (legs/pellets) electrically coupled in series (and thermally coupled in parallel) with one another, as shown in FIG. 2. FIG. 2 shows an example thermoelectric device 200 including three alternating P and N type elements $202_{1-3}$. The hot end (e.g., hot end 204) where heat is applied and the cold end (e.g., cold end 206) are also shown in FIG. 2.

Typical thermoelectric devices (e.g., thermoelectric device 200) may be limited in application thereof because of rigidity, bulkiness and high costs (>$20/watt) associated therewith. Also, these devices may operate at high temperatures using active cooling. Exemplary embodiments discussed herein provide for a thermoelectric platform (e.g., enabled via roll-to-roll sputtering on a substrate (e.g., plastic)) that offers a large scale, commercially viable, high performance, easy integration and inexpensive (<20 cents/watt) route to flexible thermoelectrics.

In accordance with the exemplary embodiments, P and N thermoelectric legs may be deposited on a flexible substrate (e.g., plastic) using a roll-to-roll process that offers scalability and cost savings associated with the N and P materials. In a typical solution, bulk legs may have a height in millimeters (mm) and an area in $mm^2$. In contrast, N and P bulk legs described in the exemplary embodiments discussed herein may have a height in microns ($\mu m$) and an area in the $\mu m^2$ to $mm^2$ range.

Figure 3:
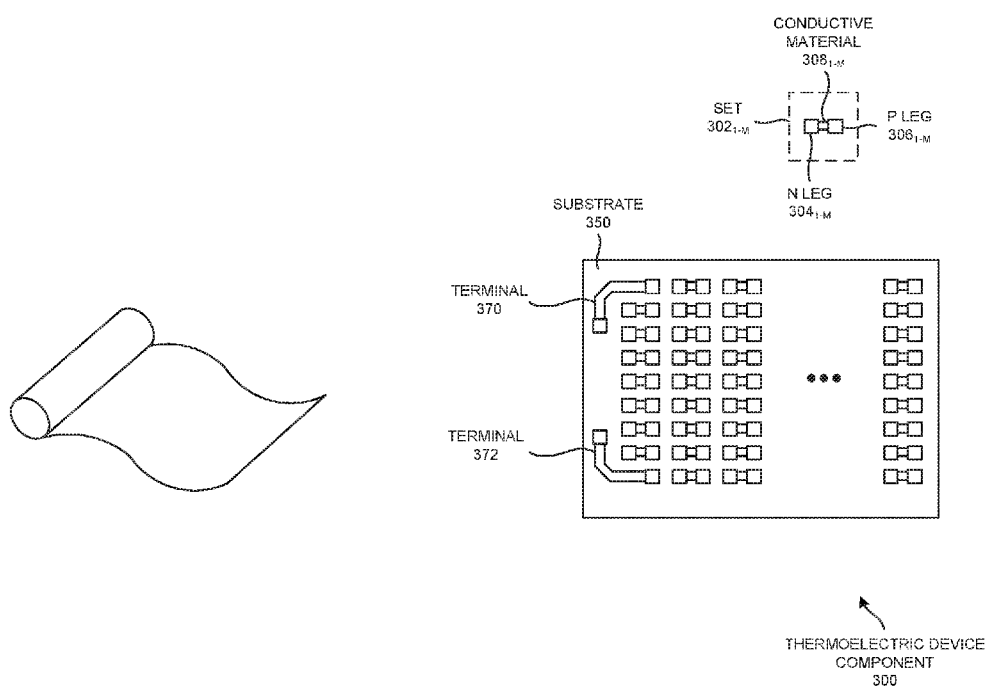
FIG. 3 is a top schematic view of a thermoelectric device component, according to one or more embodiments.

FIG. 3 shows a top view of a thermoelectric device component 300, according to one or more embodiments. Here, in one or more embodiments, a number of sets of N and P legs (e.g., sets $302_{1-M}$ including N legs $304_{1-M}$ and P legs $306_{1-M}$ therein) may be deposited on a substrate 350 (e.g., plastic) using a roll-to-roll process discussed above. FIG. 3 also shows a conductive material $308_{1-M}$ contacting both a set $302_{1-M}$ and substrate 350, according to one or more embodiments; an N leg $304_{1-M}$ and a P leg $306_{1-M}$ of a set $302_{1-M}$ electrically contact each other through conductive material $308_{1-M}$.

Figure 4:
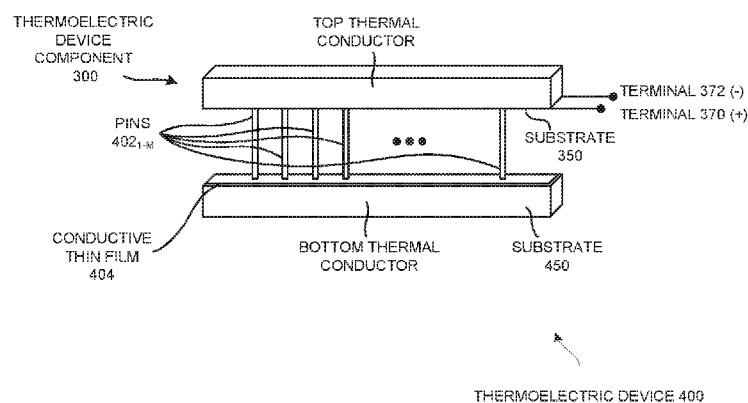
FIG. 4 is a front schematic view of a thermoelectric device including the thermoelectric device component of FIG. 3, according to one or more embodiments.

FIG. 4 shows a front view of thermoelectric device 400 including thermoelectric device component 300, according to one or more embodiments. Here, in one or more embodiments, a pin $402_{1-M}$ several times longer than the height of each of the N legs $304_{1-M}$ and P legs $306_{1-M}$ may couple an N leg $304_{1-M}$ and a P leg $306_{1-M}$ within a set $302_{1-M}$ on an end of the set $302_{1-M}$ away from substrate 350 to a conductive thin film 404. In one or more embodiments, conductive thin film 404 may be formed on another substrate 450 (e.g., plastic, same substrate as substrate 350, a substrate (e.g., flexible, rigid) different from substrate 350).

In other words, in one or more embodiments, the sets $302_{1-M}$ may be sandwiched between substrate 350 and substrate 450 by way of conductive material $308_{1-M}$, pins $402_{1-M}$ and conductive thin film 404. In one example embodiment, conductive thin film 404 may be formed on substrate 450 through sputtering. Other ways of forming conductive thin film 404 on substrate 450 are within the scope of the exemplary embodiments discussed herein. Also, it should be noted that the sets $302_{1-M}$ may, alternately, be attached/coupled to a rigid substrate such as substrate 350 instead of being sputtered onto a flexible substrate such as substrate 350. In other words, substrate 350 may be a rigid substrate or a flexible substrate.

In one or more embodiments, pins $402_{1-M}$ may be pogo pins commonly used in probe cards in the semiconductor industry for testing wafers. Pogo pins are well known to one skilled in the art; therefore, detailed discussed associated therewith has been skipped for the sake of convenience. In one or more embodiments, FIG. 3 shows terminals (370, 372) to measure the potential difference generated based on heat (or, cold) applied at an end of thermoelectric device 400. It is obvious that heat (or, cold) may be applied at any end of thermoelectric device 400; in other words, the heat (or, the cold) may be applied at an end of substrate 350 or substrate 450.

In one or more embodiments, a thermoelectric module (e.g., thermoelectric device 400) with the pin setup may offer several advantages over a traditional implementation. In one or more embodiments, a temperature difference across the thermoelectric P and N legs may be controlled by varying a height, a thickness and/or an area of pins $402_{1-M}$ (each of pins $402_{1-M}$ whose height, thickness and/or area can be varied may be used). The modularized approach to thermoelectric device 400 may provide for replacing pins $402_{1-M}$ with another set thereof having a different height of constituent individual pins, a different thickness of constituent individual pins and/or a different area of constituent individual pins. In one example implementation, the height of each pin $402_{1-M}$ may be adjusted through a spring associated therewith.

In one or more embodiments, the controllability of the height, the thickness and/or the area of pins $402_{1-M}$ may allow thermoelectric device 400/module to operate at higher temperatures and a wider temperature spectrum compared to a traditional implementation thereof. In the traditional implementation, the height of the P and N legs may be fixed based on material costs and performance. Exemplary embodiments discussed herein may offer scalability and cost savings.

Exemplary embodiments discussed herein (e.g., thermoelectric device 400) may also offer easy integration with respect to solar and solar thermal applications. As discussed above, the traditional thermoelectric module may have a size limitation and may not scale to a larger area. For example, a typical solar panel may have an area in the square meter ($m^2$) range and the traditional thermoelectric module may have an area in the square inch range. A thermoelectric module in accordance with the exemplary embodiments may be of varying sizes and/or dimensions ranging from a few $mm^2$ to a few $m^2$.

For efficient harnessing of solar energy, optimum hybridization of photovoltaic (PV) and thermoelectric devices may be considered ideal. In the PV operation, ~40% of solar spectral irradiance may spontaneously be transformed into heat by thermalization loss of high energy photons and transmission loss of low energy photons. Therefore, additional energy harvesting from waste heat may be useful not only for increasing efficiency but also for removing unwanted heat that prevents efficient PV operation. Achieving lossless coupling may enable the power output from the hybrid device be equal to the sum of the maximum power outputs produced separately from individual PV and thermoelectric devices.

Figure 5:
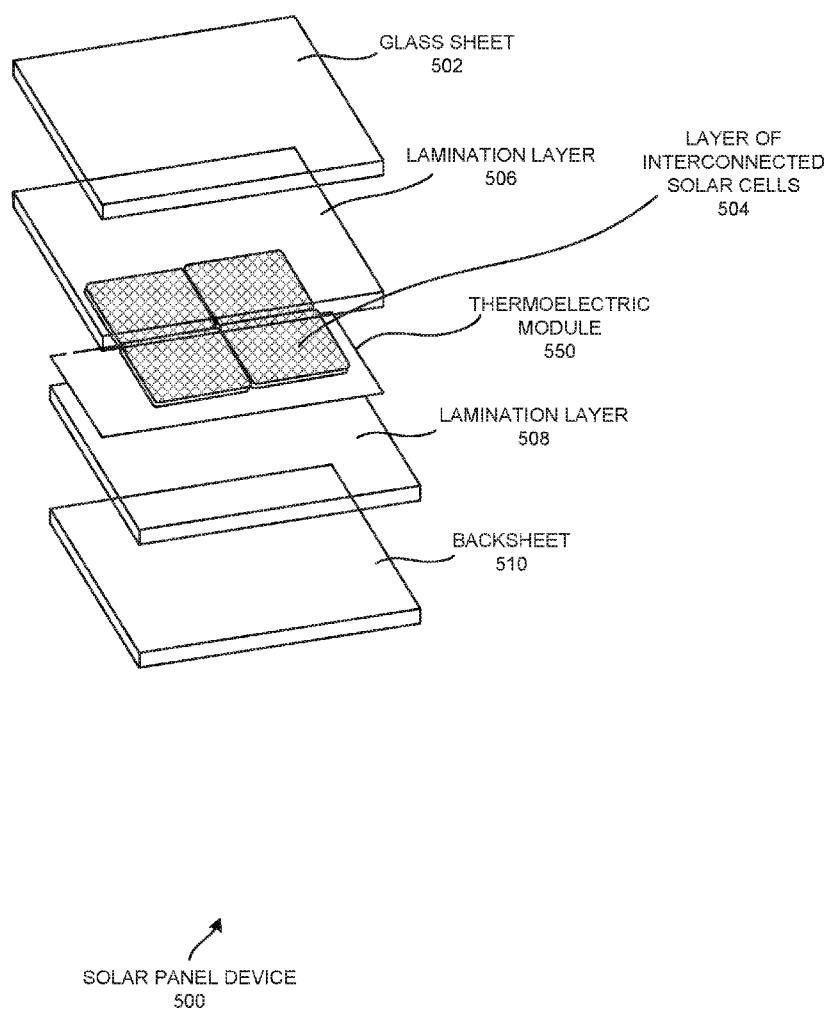
FIG. 5 is a schematic view of a solar panel device configured to have the thermoelectric device of FIG. 4 integrated therein.

FIG. 5 shows a solar panel device 500. Solar panel device 500 may include a glass sheet 502 (e.g., tempered low iron glass) under which a layer of interconnected solar cells 504 may be sandwiched between lamination layers (506, 508). In one implementation, the lamination layers (506, 508) may be made of ethyl vinyl acetate (EVA) films. The framework for solar panel device 500 may be provided by a backsheet 510, which lies underneath lamination layer 508. It should be noted that other implementations of solar panel device 500 are within the scope of the exemplary embodiments discussed herein.

Figure 6:
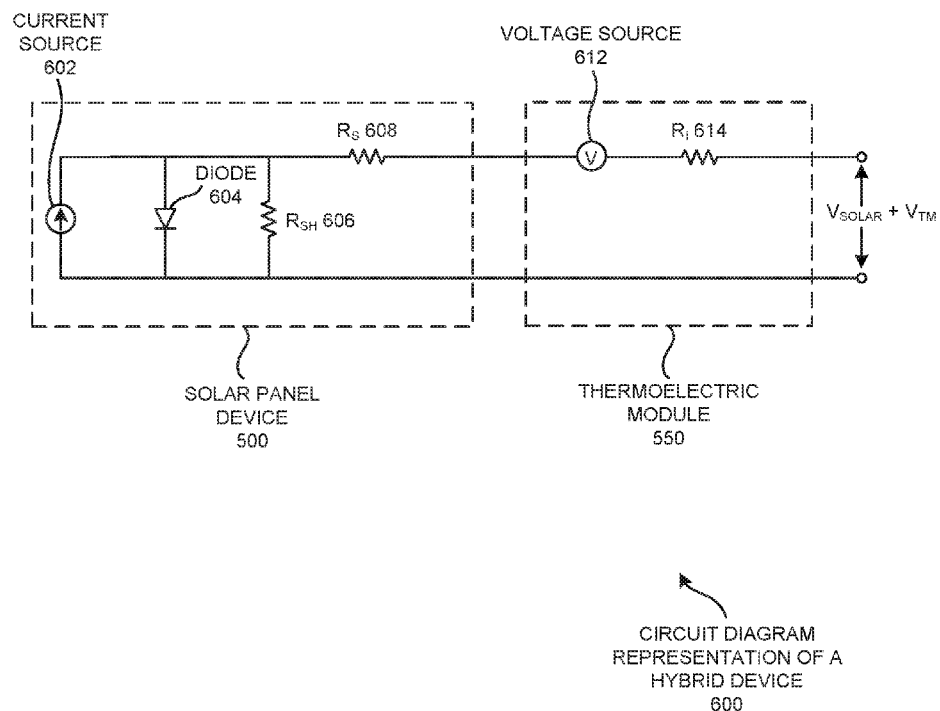
FIG. 6 is a circuit diagram representation of a hybrid device including the solar panel device of FIG. 5 and the thermoelectric device of FIG. 4 integrated therein.

In one or more embodiments, a thermoelectric module 550 (e.g., thermoelectric device 400) may be coupled to the layer of interconnected solar cells 504 between said layer of interconnected solar cells 504 and lamination layer 508 to realize the hybrid device discussed above. FIG. 6 shows a circuit diagram representation of a hybrid device 600 (e.g., solar panel device 500 with thermoelectric module 550 of FIG. 5), according to one or more embodiments. In one or more embodiments, solar panel device 500 may be represented as a current source 602 in parallel with a diode 604 and a shunt resistance $R_{SH}$ 606. In one or more embodiments, the series resistance representation of solar panel device 500 is shown as $R_s$ 608 in FIG. 6. In one or more embodiments, thermoelectric module 550 may be represented by a voltage source 612 in series with an internal resistance $R_I$ 614. FIG. 6 also shows that the output voltage of hybrid device 600 to be the sum of the voltage of solar panel device 500 ($V_{SOLAR}$) and the voltage of thermoelectric module 550 ($V_{TM}$).

Figure 7:
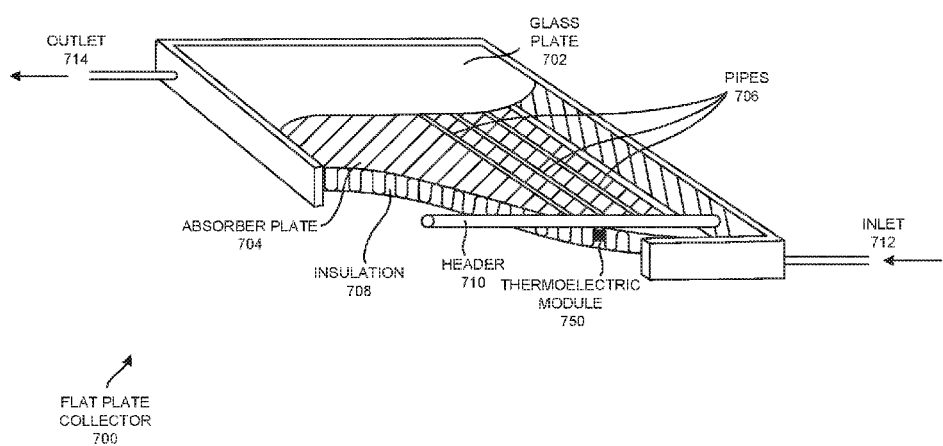
FIG. 7 is a schematic view of a flat plate collector, according to one or more embodiments.

Solar thermal collectors may be of several types including but not limited to flat plate collectors, evacuated tube collectors, Integral Collector Storage (ICS) system based collectors, thermosiphon based collectors and concentrating collectors. The most common type of solar thermal collectors may be flat plate collectors. FIG. 7 shows a flat plate collector 700, according to one or more embodiments. In one or more embodiments, flat plate collector 700 may include a glass plate 702 (e.g., tempered glass) on top and an absorber plate 704 (e.g., copper based, aluminum based) on a bottom thereof. Sunlight may pass through glass plate 702 and heat up absorber plate 704; solar energy may thereby be converted into heat energy. The heat may be passed onto liquid passing through pipes 706 attached to absorber plate 704.

The working of a typical flat plate collector is well known to one skilled in the art. Detailed discussion associated therewith has, therefore, been skipped for the sake of convenience. FIG. 7 shows insulation 708, header 710, inlet 712 and outlet 714 of flat plate collector 700 merely for the sake of completeness. It should be noted that glass plate 702 may, instead, be replaced with a polymer cover plate. Other implementations of flat plate collector 700 are within the scope of the exemplary embodiments discussed herein.

In one or more embodiments, a thermoelectric module 750 (e.g., thermoelectric device 400; analogous to thermoelectric module 550) may be integrated into flat plate collector 700 (an example solar thermal collector) at the back of absorber plate 704 (or underneath absorber plate 704). In one or more embodiments, in the case of a pure water heater system implementation, flat plate collector 700 including thermoelectric module 750 may produce electricity in addition to thermal energy to be used for lighting and other purposes; said thermal energy may also heat water at the same time. As absorber plate 704 reaches temperatures in the vicinity of 400 degrees Celsius (C), there may be a lot of temperature gradients to be exploited and harvested through thermoelectric module 750.

Figure 8:
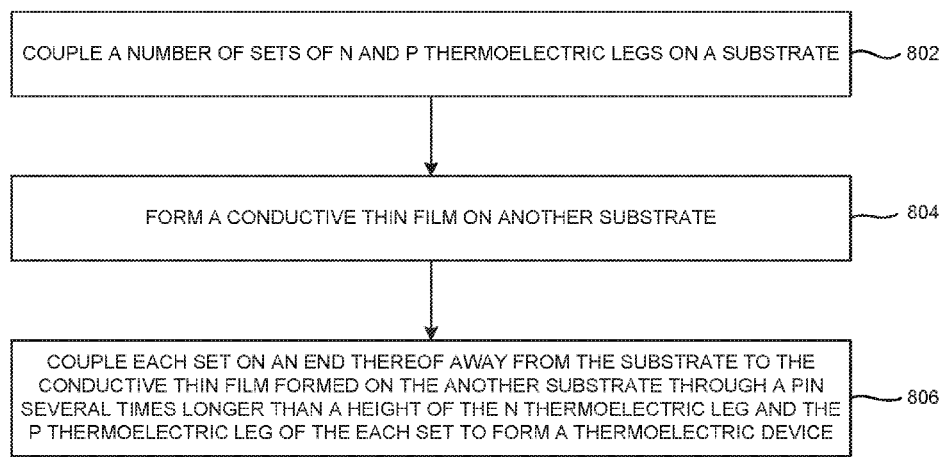
FIG. 8 is a process flow diagram detailing the operations involved in realizing the thermoelectric device of FIG. 4, according to one or more embodiments.

FIG. 8 shows a process flow diagram detailing the operations involved in realizing a pin coupling based thermoelectric device (e.g., thermoelectric device 400), according to one or more embodiments. In one or more embodiments, operation 802 may involve coupling a number of sets (e.g., sets $302_{1-M}$) of N (e.g., N legs $304_{1-M}$) and P (e.g., P legs $306_{1-M}$) thermoelectric legs on a substrate (e.g., substrate 350). In one or more embodiments, the each set may include an N thermoelectric leg and a P thermoelectric leg electrically contacting each other through a conductive material (e.g., conductive material $308_{1-M}$) on the substrate.

In one or more embodiments, operation 804 may involve forming a conductive thin film (e.g., conductive thin film 404) on another substrate (e.g., substrate 450). In one or more embodiments, operation 806 may then involve coupling the each set on an end thereof away from the substrate to the conductive thin film formed on the another substrate through a pin (e.g., pin $402_{1-M}$) several times longer than a height of the N thermoelectric leg and the P thermoelectric leg of the each set to form/realize the thermoelectric device (e.g., thermoelectric device 400).

Figure 9:
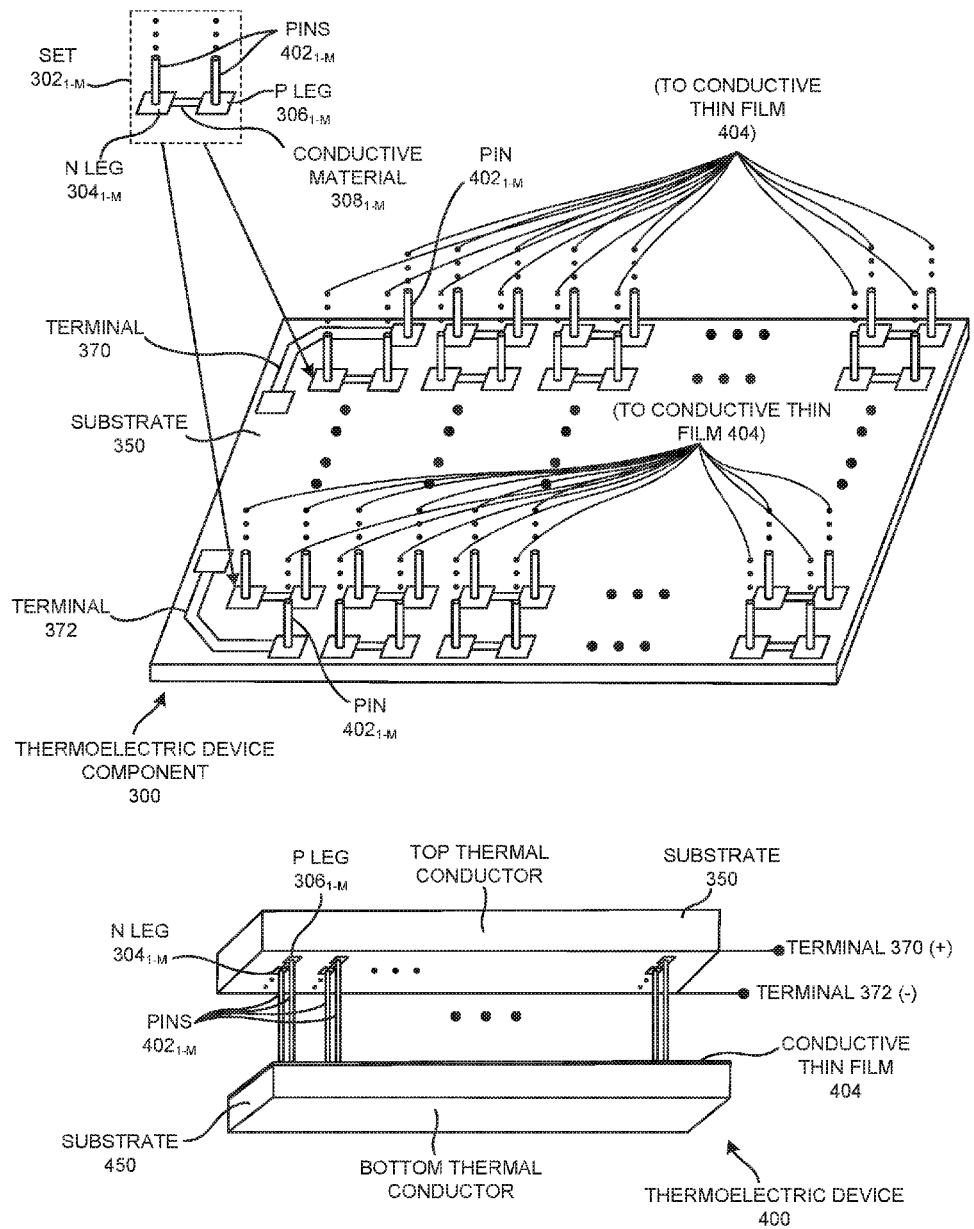
FIG. 9 is another front schematic view of the thermoelectric device of FIG. 4 including the thermoelectric device component of FIG. 3 with pins, according to one or more embodiments.

FIG. 9 shows another front schematic view of thermoelectric device 400 including thermoelectric component 300 with pins $402_{1-M}$, according to one or more embodiments. Here, the connection of pins $402_{1-M}$ to N legs $304_{1-M}$ and P legs $306_{1-M}$ within sets $302_{1-M}$ on substrate 350 is shown. Also, FIG. 9 shows connection of said pins $402_{1-M}$ to conductive thin film 404 on substrate 450. The perspective view (second of two views in FIG. 9) of thermoelectric device 400 in FIG. 9 omits the physical depiction of terminals (370, 372) merely because the surface of substrate 350 across which N legs $304_{1-M}$ and P legs $306_{1-M}$ are deposited is crowded. However, terminals (370, 372) are depicted as lines with polarities. The location of terminals (370, 372) on the surface of substrate 350 in the perspective view of thermoelectric device 400 can easily be deduced from location thereof on thermoelectric component 300 (first view in FIG. 9) in both FIG. 9 and FIG. 3.

It should be noted that the exemplary embodiments discussed above do not limit application thereof to solar devices (e.g., hybrid solar device 600, flat plate collector 700). For example, in low temperature applications such as harvesting body heat in a wearable device, a milli-volt (mV) output of thermoelectric device 400 may be boosted using a Direct Current (DC)-DC converter to a desired voltage output (e.g., 3.3 V) to augment a life of a battery used or to replace said battery. Also, it should be noted that additional electronics and/or wiring may be needed to integrate thermoelectric device 400 within a device/system associated with relevant applications (e.g., automotive devices/components, Internet of Things (IoT).

Although the present embodiments have been described with reference to specific example embodiments, it will be evident that various modifications and changes may be made to these embodiments without departing from the broader spirit and scope of the various embodiments. Accordingly, the specification and drawings are to be regarded in an illustrative rather than a restrictive sense.

What is claimed is:

1. A hybrid solar-thermoelectric device comprising:
   a solar device; and
   a thermoelectric device coupled to the solar device, the thermoelectric device comprising:
      a flexible first substrate;
      a plurality of sets of N and P thermoelectric legs coupled to the first substrate, each set comprising an N thermoelectric leg and a P thermoelectric leg electrically contacting each other through a conductive material on the first substrate;
      a rigid second substrate;
      a conductive thin film formed on the second substrate; and
      a plurality of pins corresponding to the plurality of sets of N and P thermoelectric legs, each pin coupling the each set on an end thereof away from the first substrate to the conductive thin film formed on the second substrate, and the each pin being several times longer than a height of the N thermoelectric leg and the P thermoelectric leg of the each set,
      wherein a temperature difference across the N thermoelectric leg and the P thermoelectric leg of the each set on the first substrate is controlled based on at least one of: varying a height of the each pin, varying a thickness of the each pin and replacing the each pin with another pin having a different area therefrom.

2. The hybrid solar-thermoelectric device of claim 1, wherein the solar device is one of:
   a solar panel device and a solar thermal collector.

3. The hybrid solar-thermoelectric device of claim 1, wherein the plurality of sets of N and P thermoelectric legs of the thermoelectric device is deposited on the first substrate through a roll-to-roll sputtering process.

4. The hybrid solar-thermoelectric device of claim 1, wherein the conductive thin film of the thermoelectric device is formed on the second substrate through sputtering.

5. The hybrid solar-thermoelectric device of claim 1, wherein the each pin of the thermoelectric device is a pogo pin.

6. The hybrid solar-thermoelectric device of claim 1, wherein one of: heat and cold is configured to be applied at an end of one of: the first substrate and the second substrate of the thermoelectric device.

7. The hybrid solar-thermoelectric device of claim 6, wherein the thermoelectric device further comprises a set of terminals formed on the first substrate to measure potential difference generated based on the application of the one of: the heat and the cold to the end of the one of: the first substrate and the second substrate.

8. A hybrid solar-thermoelectric device comprising:
   a solar device; and
   a thermoelectric device coupled to the solar device, the thermoelectric device comprising:
      a flexible first substrate;
      a plurality of sets of N and P thermoelectric legs coupled to the first substrate, each set comprising an N thermoelectric leg and a P thermoelectric leg electrically contacting each other through a conductive material on the first substrate;
      a rigid second substrate;
      a conductive thin film formed on the second substrate; and
      a plurality of pins corresponding to the plurality of sets of N and P thermoelectric legs, each pin coupling the each set on an end thereof away from the first substrate to the conductive thin film formed on the second substrate, and the each pin being several times longer than a height of the N thermoelectric leg and the P thermoelectric leg of the each set,
      wherein one of: heat and cold is configured to be applied at an end of one of: the first substrate and the second substrate, and
      wherein, in accordance with the application of the one of: the heat and the cold at the end of the one of: the first substrate and the second substrate, a temperature difference across the N thermoelectric leg and the P thermoelectric leg of the each set on the first substrate is controlled based on at least one of: varying a height of the each pin, varying a thickness of the each pin and replacing the each pin with another pin having a different area therefrom.

9. The hybrid solar-thermoelectric device of claim 8, wherein the solar device is one of:
   a solar panel device and a solar thermal collector.

10. The hybrid solar-thermoelectric device of claim 8, wherein the plurality of sets of N and P thermoelectric legs of the thermoelectric device is deposited on the first substrate through a roll-to-roll sputtering process.

11. The hybrid solar-thermoelectric device of claim 8, wherein the conductive thin film of the thermoelectric device is formed on the second substrate through sputtering.

12. The hybrid solar-thermoelectric device of claim 8, wherein the each pin of the thermoelectric device is a pogo pin.

13. The hybrid solar-thermoelectric device of claim 8, wherein the thermoelectric device further comprises a set of terminals formed on the first substrate to measure potential difference generated based on the application of the one of: the heat and the cold to the end of the one of: the first substrate and the second substrate.

14. A hybrid solar-thermoelectric device comprising:
   a solar device; and a thermoelectric device coupled to the solar device, the thermoelectric device comprising:
- a flexible first substrate;
- a plurality of sets of N and P thermoelectric legs coupled to the first substrate, each set comprising an N thermoelectric leg and a P thermoelectric leg electrically contacting each other through a conductive material on the first substrate;
- a rigid second substrate;
- a conductive thin film formed on the second substrate;
- a plurality of pins corresponding to the plurality of sets of N and P thermoelectric legs, each pin coupling the each set on an end thereof away from the first substrate to the conductive thin film formed on the second substrate, and the each pin being several times longer than a height of the N thermoelectric leg and the P thermoelectric leg of the each set; and
- a set of terminals formed on the first substrate to measure potential difference generated based on application of one of: heat and cold at an end of the thermoelectric device,
- wherein a temperature difference across the N thermoelectric leg and the P thermoelectric leg of the each set on the first substrate is controlled based on at least one of: varying a height of the each pin, varying a thickness of the each pin and replacing the each pin with another pin having a different area therefrom.

15. The hybrid solar-thermoelectric device of claim 14, wherein the solar device is one of: a solar panel device and a solar thermal collector.

16. The hybrid solar-thermoelectric device of claim 14, wherein the plurality of sets of N and P thermoelectric legs of the thermoelectric device is deposited on the first substrate through a roll-to-roll sputtering process.

17. The hybrid solar-thermoelectric device of claim 14, wherein the conductive thin film of the thermoelectric device is formed on the second substrate through sputtering.

18. The hybrid solar-thermoelectric device of claim 14, wherein the each pin of the thermoelectric device is a pogo pin.

19. The hybrid solar-thermoelectric device of claim 14, wherein the one of: the heat and the cold is configured to be applied at an end of the first substrate of the thermoelectric device.

20. The hybrid solar-thermoelectric device of claim 14, wherein the one of: the heat and the cold is configured to be applied at an end of the second substrate of the thermoelectric device.

* * * * *